United States Patent [19]
Hopfer

[11] 3,931,573
[45] Jan. 6, 1976

[54] RADIATION DETECTOR

[75] Inventor: Samuel Hopfer, Brooklyn, N.Y.

[73] Assignee: General Microwave Corporation, Farmingdale, N.Y.

[22] Filed: May 5, 1972

[21] Appl. No.: 250,582

[52] U.S. Cl. ..................... 324/106; 324/95; 325/67; 343/703
[51] Int. Cl.² ..................... G01R 5/26; G01R 21/04
[58] Field of Search ........ 324/106, 46, 95; 136/212, 136/211, 213; 250/83.3 R, 83.3 H; 310/4; 325/67, 363; 343/703

[56] References Cited
UNITED STATES PATENTS

| | | | |
|---|---|---|---|
| 3,147,436 | 9/1964 | Hopfer | 324/95 |
| 3,535,523 | 10/1970 | Wunderman et al. | 250/351 |
| 3,641,439 | 2/1972 | Aslan | 324/106 X |
| 3,794,914 | 2/1974 | Aslan | 324/95 |

OTHER PUBLICATIONS

Aslan; IEEE Trans. Instr. & Meas., Vol. IM-19, No. 4, Nov. 1970.

Hopfer et al., Ire. Int. Conv. Rec. V. 10, p. -3; 1962; pp. 77-84.

Primary Examiner—Alfred E. Smith
Assistant Examiner—Ernest F. Karlsen
Attorney, Agent, or Firm—Esquire Jacobs

[57] ABSTRACT

A detection device for electromagnetic radiation uses strips of thin resistive films connected in electrically conductive paths with the area of spacing between adjacent ones of the strips being greater than the area of the strips to achieve an impedance which is largely resistive over a broad band of radio frequencies. The strips are mounted in dielectric material and exposed to free space radiation. A radiation hazard meter is produced with thermally sinked thermocouple elements forming the resistive strips.

33 Claims, 10 Drawing Figures

RADIATION DETECTOR

BACKGROUND OF THE INVENTION

This invention relates to radiation detection devices for electromagnetic radiation, and particularly to such devices which are useful for a broad band of frequencies and generally isotropic.

On application of this invention is as a radiation hazard meter. The increasing use of high power radio frequency and microwave power sources in military, commercial and consumer applications has resulted in a corresponding increase in concern regarding the potential biological hazards of human exposure to electromagnetic radiation. Although there is some disagreement as to the threshold radiation level which causes serious physiological damage, most medical and bio-engineering researchers agree that this level is far below that which can be sensed by exposed human beings.

For many years, researchers and military and industrial safety personnel have employed several types of instruments for measuring radiation intensity levels in terms of milliwatts per square centimeter. Generally, these instruments are basically r-f power sensing devices with some form of antenna pick-up to intercept the electromagnetic field; see, for example, U.S. Pat. Nos. 1,923,916 and 3,641,439. This instrument type suffers from one or more of several disadvantages. Realizable antennas place limitations on bandwidth, particularly in the lower frequency ranges and do not provide a constant "effective aperture." One instrument employs seven antennas to circumvent this problem. In addition, antennas employ conducting surfaces which, because of interaction effects, degrade the reliability of near field measurements. Since it is to be anticipated that people will be increasingly exposed to radiation fields of many frequencies, a broadband instrument is desirable which is practical in size. Moreover, the instrument should be generally effective without limitation on its orientation to the polarized radiation field.

The monitoring of r-f radiation by resistive sensors, instead of antennas, is described in U.S. Pat. No. 2,496,879 and in the paper, "Thin-Film Spherical Bolometer for Measurement of Hazardous Field Intensities from 400 $MH_z$ to 40 $GH_z$," by Fletcher and Woods, published in "Non-ionizing Radiation," Sept. 1969, which cites a British Patent 965,559/64 to Woods. The use of thermocouples in waveguides for measuring radiation at radio frequencies is described in U.S. Pat. Nos. 3,384,819, 3,147,436 and 2,106,768.

SUMMARY OF THE INVENTION

It is among the objects of this invention to provide a new and improved radiation detector.

Another object is to provide a new and improved detector for radiation fields in free space which is effective over a broadband of radio frequencies.

Another object is to provide a new and improved radiation detector which is generally isotropic in detecting polarized radiation fields in free space.

Another object is to provide a new and improved radiation hazard meter which is generally effective in detecting polarized fields over a broadband of radio frequencies.

Another object is to provide a new and improved radiation hazard meter which has a generally fast time response to detected radiation and is generally insensitive to ambient thermal conditions.

In one form of the invention, a radiation detection device uses thin resistive films for absorbing the electromagnetic radiation in free space. The thin resistive films are arranged in spaced strips and connected in electrically conductive paths with the area of spacing between adjacent ones of the strips being greater than the area of the strips to achieve an impedance of the order of that free space which is largely resistive over a broadband of radio frequencies. The strips are mounted in dielectric material for exposure to free space radiation and insulation from infra-red. In one embodiment, a radiation hazard meter is produced with thermally sinked thermocouple elements forming the resistive strips. The thermocouple strips are arranged in two planar arrays that are transversely oriented to detect electric fields having a component in the plane of the arrays. A third, orthogonal array is used in another embodiment for fully isotropic detection.

BRIEF DESCRIPTION OF THE DRAWING

The foregoing and other objects of this invention, as well as the various features thereof, will be more fully understood from the following description when read together with the accompanying drawing, in which.

In the drawing, corresponding parts are referenced throughout by similar numerals.

DESCRIPTION OF A PREFERRED EMBODIMENT

Figure 1:
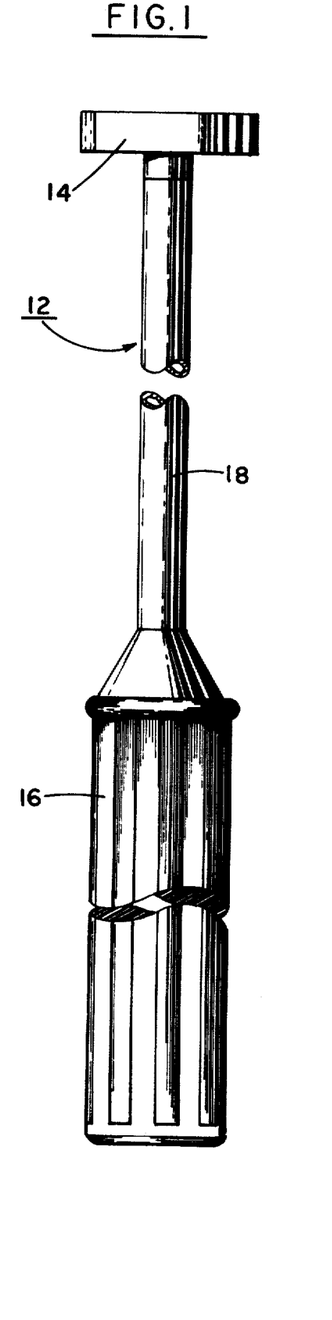
FIG. 1 is a perspective view of a radiation detector or space probe for near-field applications embodying this invention.
Figure 2:
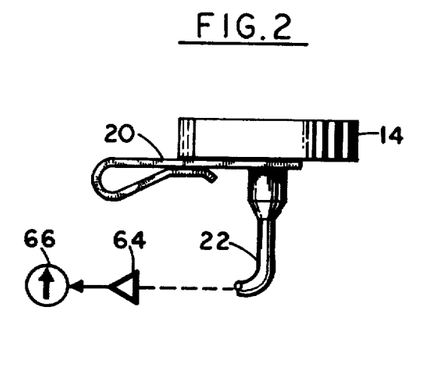
FIG. 2 is a perspective view of the radiation detector or probe with a lapel clip which may be used as a radiation hazards meter for far-field and personnel safety applications.

In FIG. 1, a radiation-detector probe 12 is shown having a detector unit 14 at the end thereof together with a handle 16 for operator manipulation, with a dielectric extension rod 18 connecting the detector unit 14 to the handle 16. The handle 16 may be made in hollow form to serve as an instrument housing for various parts of the electrical circuitry and metering (including batteries) that are customarily used with the probe and connected to it by wires through rod 18. As shown in FIG. 2, the detector unit 14 may be secured to a pocket or lapel by means of a clip 20, with suitable cabling 22 connecting the detector unit 14 to batteries and instrumentation that may be carried in the user's pockets.

As shown in FIGS. 3, 4, 5 and 6, the detector unit 14 includes a dielectric housing 24, which may be suitably constructed of a plastic such as styrofoam, which is used to absorb infra-red radiation and limit its passage to the internal sensitive element. The cup-shaped housing element 24 has a cover plate 26 of similar material secured to it, which completely encloses the sensitive element therein. Another plastic housing 28 (e.g. of phenylenoxide) provides structural strength to the dielectric enclosure and has a cover 30 which completely encloses the sensitive element that forms the detector. In one form of the invention, it has been found suitable to replace the two plastic housings 24–30 by a single molded styrofoam unit which has the desired structural strength and which is sufficiently massive to provide a large thermal constant for the overall device. This has a low dielectric constant to avoid interference with the radiation field to be measured and a low dissipation factor for low absorption of that radiant energy. Thus, no highly conductive metals are used in the housing (except for connectors) and spurious diffraction effects are avoided.

Within the plastic housings 24 and 28 are two detector elements 32 and 34, retained between two dielectric discs 86 and 88. The elements 32 and 34 are fabricated of a dielectric substrate 36 on which are formed thin-film resistive strips 38 and 39, respectively, of thermoelectric material, each of which is arranged in a zig-zag array 41 of thermocouple elements. That is, the sequences of rows or strips 38, 38', 38'' and 39, 39' and 39'' of resistive material for the two detector elements 32 and 34 are connected as an array of thermocouples. Each strip 38 or 39 includes a plurality of thermocuples formed by alternating rectangular layers 40, 42 (FIG. 6) of two dissimilar thermoelectric materials, suitable forms of which are bismuth and nichrome. These resistive layers are preferably formed of thin films of resistive metals or metallic alloys, deposited by appropriate vacuum deposition techniques or the like through masks onto the dielectric substrate 36 that forms the structural support for each of the two elements 32 and 34. The thickness of the layers is small with respect to skin depth at the highest frequencies of the operating bandwidth to ensure broadband operation. Each pair of resistive layers 40 and 42 overlap at their ends to form a hot junction 44, and overlap with layers of the opposite types of material at their other ends to form cold junctions 46. The thermocouples in one strip 38 are connected to those in another strip 38' adjacent to it by means of still another thermocouple formed from a pair of layers 40 and 42 connected between the two rows. Thereby, each of the two elements 32 and 34 contains a zig-zag array 41 in planar form of thermocouples deposited as overlapping thin films. The arrays 41 in the two elements 32 and 34 are substantially identical, except that (as may be seen in FIGS. 4, 5 and 6) the two arrays are arranged in transverse orientation, with one rotated 90° to the other to form together a grid which is best illustrated in the plan view of FIG. 6, and in idealized form in FIG. 7.

The lower array 34 has on its outer (lower, as viewed in FIG. 5) face thin film depositions of silver or other highly conductive material to form two conductive legs 48 and 50 respectively between terminals 52 and 54 and terminals 56 and 58, extending generally radially outward from the center where the terminals 52 and 56 form connections for engagement with a pair of connector pins 60 and 62. The latter are used for electrical circuit connections to an external metering device in the form of a d-c amplifier 64, having a high impedance input, and a meter 66 (FIG. 2) via twisted wires 68 connected through a dielectric plug 70 to the connector pins 60 and 62 in the embodiment of FIG. 5. The plug 70 has a flat side to form a D-shape which mates with a similarly shaped hole 71 through disc 88. On the lower face of element 34 are also formed a pair of terminals 72 and 74 which are interconnected by a multi-legged conductive strip 76.

The terminals 54, 58, 72 and 74 on element 34 are formed about holes in the substrate 36, which have a conductive plating to provide corresponding terminals on the opposite face of element 34. Thereby, terminals 58 and 74 are connected to the extreme ends of the zig-zag array 41 on the opposite face of element 34. The other terminals 54 and 72 respectively connect by pressure contact to conductive terminals 78 and 80 formed on the inside (lower, in FIG. 5) face of element 32.

Figure 5:
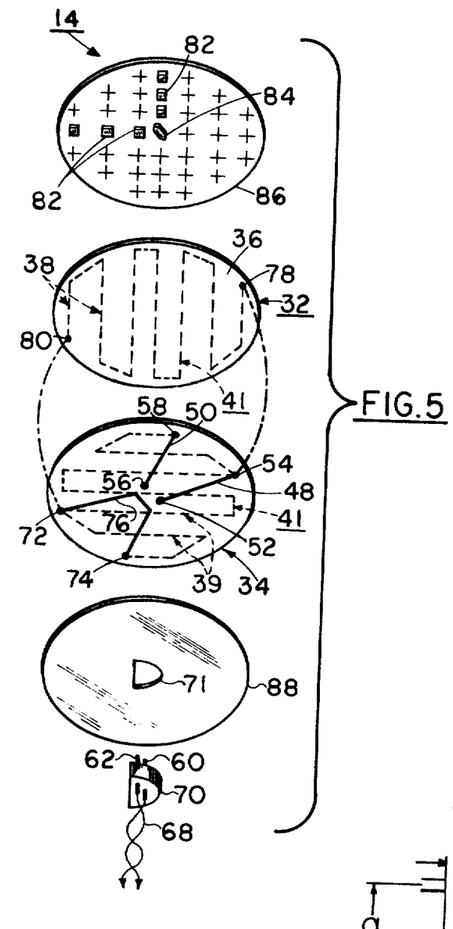
FIG. 5 is an exploded view of a detector unit similar to that of FIG. 4, but with modification, and as seen from the bottom of the unit.
Figure 6:
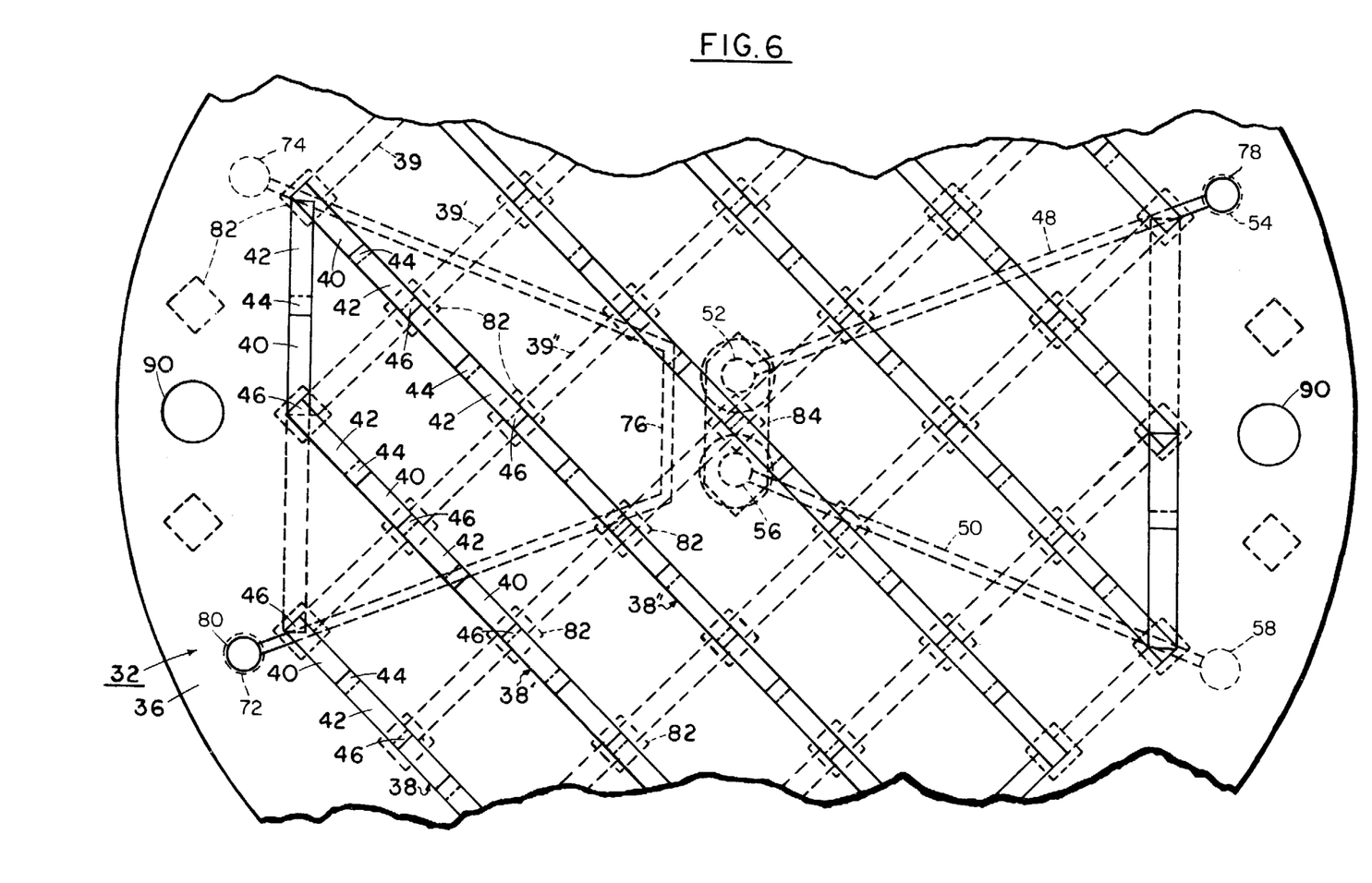
FIG. 6 is an enlarged top view of the elements of the detector unit of FIG. 5 in relation to other parts.

The electrical circuit formed by the interengagement of the terminals 54 and 72 to 78 and 80 may be traced starting at the terminal 52, which is engaged by external connector pin 60 and which connects via conductive leg 48 to terminal 54. From the latter, a pressure connection is made to terminal 78 on element 32, which in turn is connected through a plated-through hole to the opposite face of that element and to one end of the zig-zag array 41 of thermocouple strips 38 thereon. At the opposite end of the array 41 on element 32, terminal 80 connects via a plated-through hole and pressure engagement, to terminal 72 on element 34, which in turn is connected via leg 76 to the plated-through hole and terminal 74 at the end of the array of strips 39 on the opposite face of element 34. The connection through those strips 39 is to terminal 58, and via a plated-through hole and leg 50 to the terminal 56 which contacts the other external connector pin 62.

Figure 3:
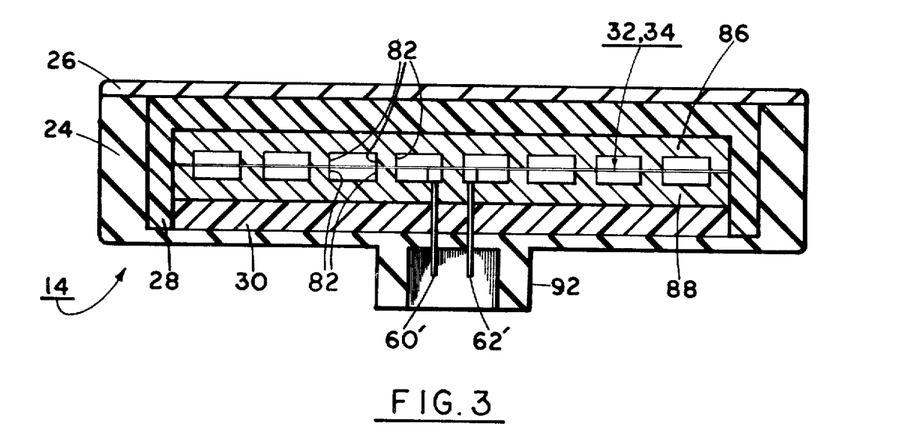
FIG. 3 is a side elevation view of the detector shown in FIGS. 1 and 2.
Figure 4:
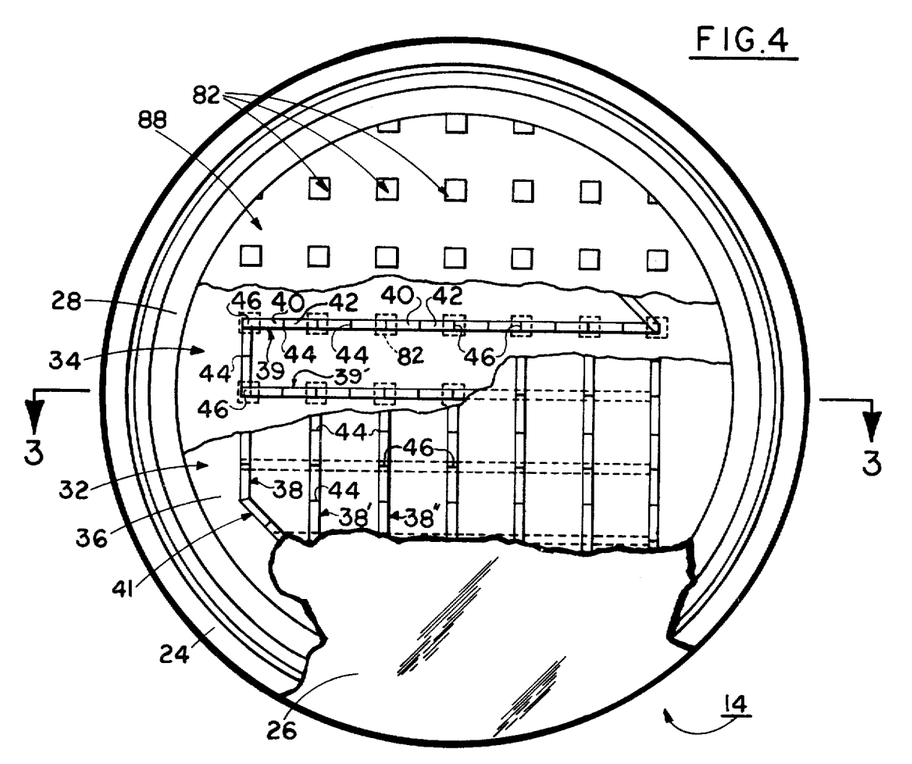
FIG. 4 is a top view of the detector of FIG. 3, with parts broken away.

The elements 32 and 34 are retained under pressure between the two dielectric discs 86 and 88. The latter have formed thereon a plurality of square projections or pads 82, each in an identical square array at locations to contact the corresponding cold junctions 46 of the elements 32 and 34 in association therewith. The arrays 41 are oriented and precisely positioned by suitable means such as indexing holes 90 in the substrates and pins (not shown) on discs 86 and 88. Thereby, the cold junctions 46 of the two arrays 41 are aligned at the cross-over points of those arrays and retained between the opposing pairs of pressure pads, which are also aligned. In addition, a large projection 84 at the center of the element 86 forms a pad over which lie the central terminals 52 and 56 whereby a pressure point connection can be made to those terminals with pins 60 and 62 by the pressure insertion of plug 70 in hole 71. Alternatively, as shown in FIG. 3, fixed connector pins 60', 62' may be similarly located at the center of the unit and pass through the housing members 24 and 30 to a socket 92 formed in the lower part of the housing 24.

The dielectric discs 86 and 88 are formed of a material having a low dielectric constant to avoid diffraction effects on the fields, and a high thermal conductance. A preferred material for this purpose is boron nitride; other suitable materials, but somewhat less effective, are beryllium oxide and alumina. The cuts between the square pads 82 are made rather deep (e.g. about 15 mils deep) to provide large air spaces that further lower the equivalent dielectric constant of the unit. The bulky discs 86 and 88 provide a substantial thermal sink for the cold junctions; the pads 82 are in good thermal contact with the cold junctions, directly in the case of disc 86 and element 32, and through the thin substrate 36 (e.g. ¼ mil Kapton) in the case of disc 88 and element 34. In the latter case, there is good thermal conductance through the thin substrate.

In operation, the thermocouples of the two arrays or elements 32 and 34 are connected, as outlined above, in series aiding fashion. With heating of the hot junctions 44 relative to the cold junctions 46, upon absorption of radiation (as explained hereinafter) the thermoelectric effect for each thermocouple results in the generation of a proportional direct voltage. The cumulative effect of these voltages, in aiding relation, results in a direct output voltage across the terminals 52, 56 which is supplied to the metering circuit as a measure of the absorbed radiation. However, if all of the cold junctions were not at substantially the same reference temperature, there would be higher temperatures in some regions and lower in others. This operating condition would lead to one or more temperature reversals from the proper relationships, and consequently the voltages would not all be in aiding relation; thus, if outputs of some thermocouples oppose those in others, an erroneous output would be produced. By means of the discs 86, 88, the cold junctions are in good contact with a thermal sink and retained at the same reference temperature, whereby reliable measurements are assured.

Figure 7:
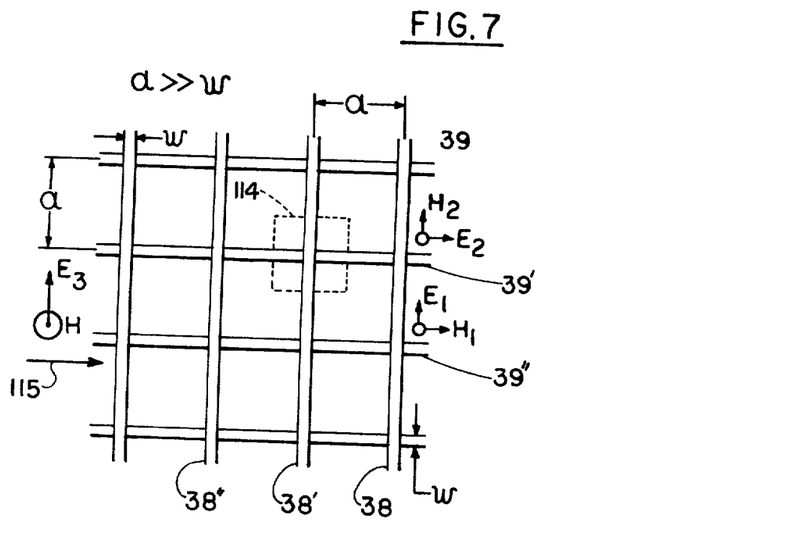
FIG. 7 is an idealized diagram of a portion of the grid of FIG. 6 used in the explanation of the invention.

With the insertion of the detector unit 14 in a radiation field, infra-red radiation is absorbed by the styrofoam shell 24 and 26, and radiation at radio frequencies is passed unimpeded to the resistive arrays of strips 38 and 39 that form a grid-like configuration shown in idealized form in FIG. 7.

The interaction with the radiation field of the detector unit 14, and particularly arrays 41, is "ohmic" in nature, i.e., absorptive and minimally reflective. Consequently, the performance is broadband, inasmuch as any time derivatives of the field quantities involved that would tend to produce a real radiation resistance are negligible. Furthermore, interaction effect of the arrays 41 in the near field is greatly reduced and tends to simulate the effect experienced by the human body. The thermal effects of the direct absorptive interaction process of the radiation with the resistive strips are utilized by means of the sequences of thermocouples to gauge the intensity of the impinging radiation. A further implication of the ohmic interaction process is the fact that it takes place via the E component of the radiation field by producing a current to flow resistively along the interface. This same mechanism, namely, the effect of an oscillating electric field on the human body, seems to be the only type of hazardous interaction presently known to exist. The absorptive character of the interface or medium tends to be substantially constant with respect to frequency. Although the human body does not quite meet this characteristic, this requirement is important from the standpoint of any absolute measurement of the intensity of radiation, which is the basis for comparative measurements. The thin metallic films used in the thermocouples (contrasted to bulk substances) meet this requirement of constancy with frequency. In addition, this is achieved with a unit which is extremely small in size, for example, a couple of inches in diameter, while the frequency band can be up to at least X-band and beyond in the microwave spectrum. In particular, a theoretical continuous thin film screen in free space with a surface resistivity equal to 377 ohms per square would reflect 10%, absorb 45%, and transmit 45% of the power incident upon it. It appears that the human body, too, reflects about 10% of the incident radiation over a reasonably wide frequency range. As a result of the broadband operational characteristic, the detector unit 14 furnishes a measurement of the power density of any frequency of radiation that is applied, and of a composite band of microwave frequencies, for example, where several sources contribute to the radiation fields.

The conversion of radiated energy into heat which occurs in the thin film is conveniently and reliably indicated through the mechanism of the thermoelectric microwave power measuring devices. There are two features of the thermolectric process; namely, the fact that an electrical signal is directly generated by the thermal conversion process, and that this signal is, to a first order, independent of the absolute temperature. The geometrically-parallel interconnected resistive thin film strips 38 and 39 afford a good approximation of the theoretical continuous screen due to sensitivity and thin-film stability, and thereby the use of the thermocouple measurement technique is made practical. Although, as a result of this use of spaced strips, a certain radiation resistance is introduced which is frequency sensitive, this effect is small so long as the ohmic strip resistance per unit length is large relative to the radiation resistance per unit length, a condition which is readily met. All dielectric materials employed in the construction of the device are preferably of low dielectric constant or relatively thin in the direction of propagation of the wave. Thereby, frequency sensitive scattering effects are minimized, and a better approximation of the free space environment for the thin film surface is achieved. The time response of the detector strips 38 and 39 to the microwave frequencies is rapid and will quickly detect a large step in radiation. However, the unit has a slow response to large ambient temperature changes by reason of the bulky styrofoam housing and thermal sink discs 86 and 88.

As noted above, in order to measure the radiation intensity over a wide band of frequencies, the fraction of power absorbed by the probe must remain substantially constant with frequency. Although this condition of presenting a constant effective aperture to the radiation field is not achievable with metallic transducers of the conventional antenna variety, it is possible to achieve this result, or come close to it, by letting the field directly interact with a properly chosen resistive screen.

Consider a plane wave at normal incidence on an infinite screen of zero thickness and of surface resistance $R_o$, normalized to that of free space. Any unit square of that screen can be characterized by an equivalent absorptive cross section $A_a$, and a reflective cross section $A_r$, which (by analysis of the equivalent circuit) may be shown to be represented by:

$$A_a = \frac{4 R_o}{(1 + 2 R_o)^2} \qquad [1]$$

and $$A_r = \frac{1}{(1 + 2R_o)^2} \quad [2]$$

Although $A_a$ and $A_r$ are seen to be independent of frequency, the use of a homogeneous resistive film does not lead to a practical design of a radiation probe, due to the high impedance required of such a film. The term absorptive (or reflective) cross-section means the ratio of absorbed (or reflective) energy per unit square to the incident energy per unit square.

The long and narrow unit resistive strip 38 or 39 of width $w$ and length $a$ (FIG. 7) is the substantial equivalent of the unit square 114 (of area $a^2$). That is, if the normalized resistance per unit square area of the unit strip of length $a$ is R, and the associated inductive reactance is $X_L$, then the above expressions for a plane wave $E_1$ or $E_2$ polarized along the strip as shown in FIG. 7 become $$A_a = \frac{4R}{(1 + 2R)^2 + 4 X_L^2} \quad [3]$$

and $$A_r = \frac{1}{(1 + 2R)^2 + 4 X_L^2} \quad [4]$$

Although the above expressions show a frequency dependence on account of $X_L$, it is seen that this change is within 10% if $$X_L \leq 0.16 + 0.32 R \quad [5]$$

Figure 10:
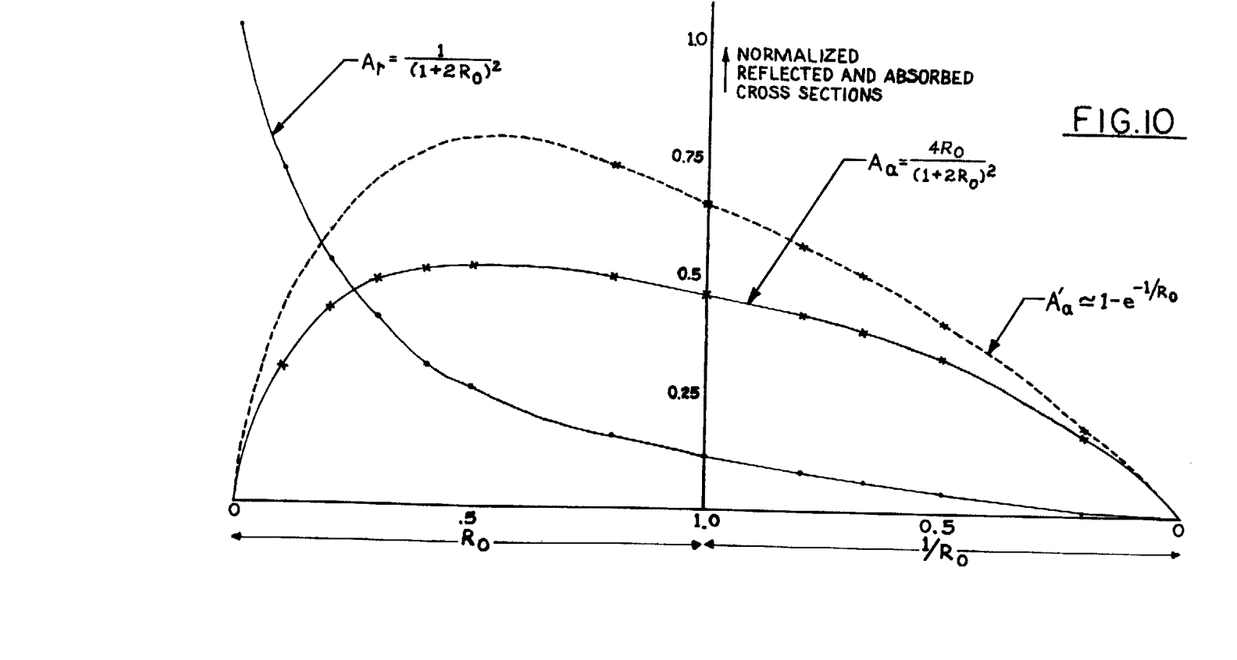
FIG. 10 is also an idealized graphical diagram used in the explanation of the invention.

Now in order to satisfy equation 5, as well as other practical constraints, the unit square dimension cannot be arbitrarily chosen. Thus, from the standpoint of good sensitivity, low reflectivity and compatible noise level, it becomes evident that R should be chosen somewhere between 1 and 2 (or higher), corresponding to absorptive cross sections of 44.5% and 32% (or less) respectively, and to reflective cross sections of 11% and 4% (or less) respectively, as shown by the curves $A_a$ and $A_r$ (FIG. 10) and of $A'_a$ which represents the edge-lit case noted below (dots and crosses on curves of FIG. 10 represent calculated values using the indicated formulas). Furthermore, if the effect of the absorbed power is detected by thermoelectric means, then it is highly desirable to limit oneself to practical surface resistances not in excess of 50 ohms per unit square, corresponding to the values of $a/w \geq 8$ for R = 1.

Now the inductance (in nanohenries) of the strip of length $a$ is approximately given by $$L = 2a \left\{ \ln \frac{2\pi a}{w} - .75 \right\} \quad [6]$$

where $a$ is in centimeters. Thus, for the case of R = 1, $a/w$ = 8, and operating through X band with less than 0.5 dB of degradation in sensitivity as in equation 5, $a$ is about 0.15 inch. Having thus determined the unit square dimensions, it is seen that an equivalent of the resistive homogeneous screen is the set of parallel strips 38 or 39 of width W, separated by a distance $a$, and of resistance R per unit square. The above equivalence of a series of unit squares 114 and the parallel strips 38 is true for a plane wave $E_1$ polarized as in FIG. 7. Similarly, that equivalence for the strips 39 is true for the plane wave $E_2$. By resort to two orthogonal sets of the strips 38 and 39, all plane waves at normal incidence have components along one or the other of the two arrays of strips 38 and 39, which components are proportionately absorbed thereby.

Figure 9:
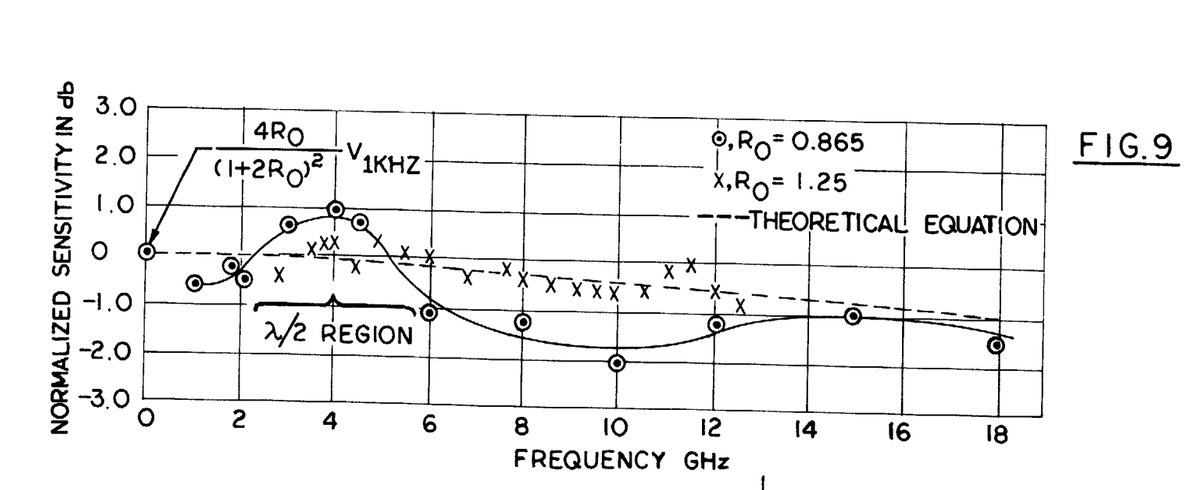
FIG. 9 is an idealized graphical diagram used in the explanation of the invention.

The arrays of strips 38 and 39 in FIG. 7 have finite overall dimensions and, due to diffraction effects, there is current discontinuity at the boundary as contrasted to the constant-current distribution of the unbounded array. While this diffraction effect is very difficult to compute, it is evident that it decreases as R is increased (i.e., the screen becomes more transparent to the field and the effects of discontinuities become less). Since the distribution of the actual current in the resistive strips 38 and 39 due to the absorbed field should be approximately expressable by a constant term and a sinusoidal type of distribution, the latter should be expected to have its greatest effect when the length of the strip is approximately half the wavelength. At higher frequencies, the integrated value of the absorbed energy should converge to that of the constant term. This general behavior is shown in the data of FIG. 9, which shows the theoretical operation of the detector unit 14 as a plot of equation 3 to show variations of sensitivity over a broad band of frequencies, as well as the operation of two such units having films of different resistance, namely, $R_o$ of 0.865 and 1.25 For the higher resistance films, the deviations from the response given by the theoretical equation 3 are seen to be considerably smaller, as expected. Considering the radiation resistance of the unit strip 38 or 39 of length a relative to $R_o$ for a uniform current distribution through X band, it may be shown that it is substantially less than 10% of the constant ohmic resistance (say of 377 ohms). Thereby, it may be concluded that the absorption characteristics for the grid are essentially independent of frequency.

In order to get a low reflectivity of radiation from the detecting surface, as well as a substantial absorption by the surface (as may be seen from the curves of FIG. 10), the surface should have a high resistive value of ohms per square. At $R_o = 1$, the impedance is 377 ohms per square with a transmission, absorption and reflection of 45%, 45% and 10%, respectively. For optimum operation, impedances of the order of 1,000 ohms per square are desirable, which (from the curves of FIG. 10) would provide a reasonably transparent absorbent screen in grid form having a transmission of about 60%, with a sufficiently large absorption and low reflection. Thereby, the operation over a broadband improves with the resistance going from about $R_o$ and lower to 2 $R_o$ and higher. In order to do this with practical films of suitable thinness and moderate resistance, stability and workability, the strips 38 and 39 are used. That is, the width of the film strip is much less than that of the unit square 114 (or the area of the strip is less than the area of spacing between strips), and with such strips the desired overall high ohms-per-square characteristic is achieved. That is, the strips have a practical thickness and a width to provide its own resistance of, say, 50 ohms per square. The overall resistance of each unit square 114 represented by the crossed unit strips 38 and 39 therein attains the high resistance that is required, but, due to the open space between strips, it is achieved with a narrow low-resistance strip instead of a uniform surface covering the entire area. Metallic films of the required high impedance for the entire unit area are not available, but thin film thermocouples of 50 ohms per square are known in the art.

Using the thermocouples, a gain effect is achieved in the voltage generation and the high sensitivity of many thermocouples in each strip 38 or 39 and in each array 41 of strips. Were a bolometer material to be used instead to measure the thermal effect of the absorbed radiation, only a single long zig-zag strip for each of two transverse elements would serve the purpose. With a bolometer, the strips may be connected in a bridge circuit to measure resistive changes with absorption, and a reference strip would be used to balance against the detecting strip in the customary fashion. If diode chips were introduced (for example, to obtain a rectification of the absorbed microwave fields), they would have to be matched to the resistance of the absorbent material and would be utilized at a number of points along each strip by breaking the strip and inserting the chips (e.g., at locations similar to the hot junctions 44). Thereby, a d-c voltage would be produced with a cumulative effect of the individual diode chips. Such diodes would respond directly to the applied electric field to produce a corresponding current flow. The thermocouples and bolometer elements respond to the thermal effects of the absorbed radiant energy and thereby would provide a measure of the power density of the radiant field.

The detector unit has a substantially isotropic operation. As shown in FIG. 7, with a plane wave at normal incidence to the planar array of strips 38 and the electric field $E_1$ along the strips 38, the radiant energy is absorbed by those strips. There is substantially no absorption by transverse strips 39 since there is a high transverse impedance due to the transverse capacitance of the air space. Similarly, in the case of the field normally incident and the electric field $E_2$ along strips 39, the latter absorb the field's energy. For a normally incident field, with the electric field along some intermediate direction, components of that field are along both the strips 38 and the transverse strips 39, the absorption in each array is of the parallel component of polarization to produce a proportionate voltage output. The voltage outputs of the two arrays of strips 38 and 39 are added by their series aiding connection to provide a correct measure of the total power density.

In a second type of case, the E vector is in the plane of the two arrays of strips 38 and 39, but the H vector may make any angle with the arrays. The extreme example of this situation is the edge-lit case illustrated by the vector $E_3$ with the H vector transverse to the plane and the incidence of the wave represented by arrow 115. Analysis by analogy to a waveguide approximation of the free space situation with equivalent impedances and measurements with unit 14 indicates that the absorption of radiation is relatively insensitive to the angle of incidence. The variation of absorption for the edge-lit case is negligible at low frequencies up to about 3 g$H_z$, and is about 2 db below that of normal incidence at high frequencies. Thus, if the probe unit 14 is rotated about any of its principal axes in a fixed field, variations of measurement of 2 db may occur. But in each direction, except with the E field perpendicular, a substantial output is produced. For intermediate angles of incidence, the absorption is similarly insensitive to the direction, and to frequency as well. The edge-lot absorption characteristic $A'_a$ is shown in FIG. 10, and tends to approach that of $A_a$ for the broadside or normal incidence. Where the H vector is parallel to the film, the absorption pattern is close to a cosinusoidal variation based on the angle of the E vector to array plane. Where the E vector is perpendicular to the plane of the film, no currents are generated and no absorption takes place; however, by using a third array in a perpendicular plane, as in the embodiment of FIG. 8, a fully isotropic response is achieved. For the edge-lit case in this situation of the H vector in the plane of the arrays and the E vector non-perpendicular, the film does interact with the magnetic field and a component of the E vector along the thin film strips 38 or 39, and the strips extract energy from the propagating wave.

The human body and the resistive thin films react and interact with the external field in similar ways, namely, in an absorptive manner via the E field component. For near field measurements, the plane of the array can be considered as receiving plane waves originating from different directions, since the total electromagnetic field in the vicinity of the source is rather complex, being made up of infinite sets of modal functions of different varieties. In this near field complexity, the arrays of resistive strips 38 and 39 are largely insensitive to orientation and its absorption represents a reasonable measure of the total integrated radiation exposure. The volume absorption in the human body is likewise isotropic, so that exposure measurements with the resistive films are directly related. In contrast, an antenna structure with its lossless conductors is non-isotropic and has a strong interaction with the source.

Figure 8:
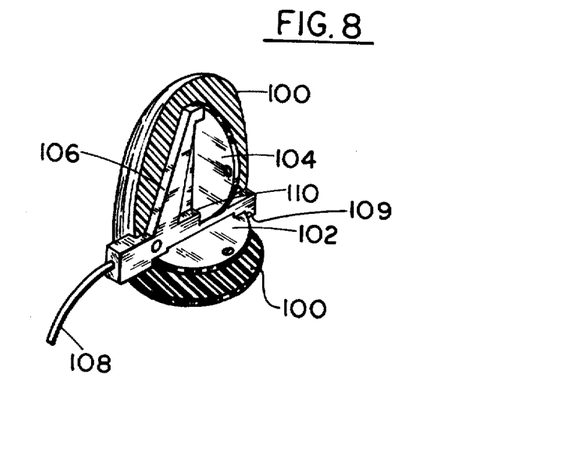
FIG. 8 is a perspective view of a modified form of the invention.

The construction embodied in FIG. 8 contains three planar arrays for three orthogonal directions of field polarization. A detector unit 102 is made up of a pair of detector elements retained between a pair of thermal-sink discs similar to the unit 14 shown in FIG. 5. In addition, a unit 104 is provided which consists of a single detector element and a single thermal-sink disc (similar to the element 32 and disc 86). The plane of the element of unit 104 and the parallel resistive strips of its array are orthogonal to the plane of the unit 102 and to the strips 38 and 39, whereby an E vector normal to the plane of unit 102 is along the strips of unit 104 to be absorbed thereby. A support structure 106 is provided which has two arms to support the two units 102 and 104 in the desired orthogonal relationship. Shoulders 109 in one arm retain the unit 102 in place, and shoulders 110 at right angles in the other arm retain the unit 104 in proper orientation. The connection of contacts to the active thermocouple elements of the arrays in the two units 102 and 104 may be made in any desired fashion, for example, in a manner similar to that shown in FIGS. 3 or 5. The thermocouples in the two units 102 and 104 are connected by means of such contact or connector elements in series aiding relation so that all three arrays of thermocouples are in such a relation and a single pair of twisted connector wires are provided through the support structure 106 externally via a suitable cable 108. The entire structure is encased in a styrofoam insulation 100 to provide the desired thermal isolation from the ambient in the manner described above. In operation, the double array unit 102 operates in the same fashion as that described above for unit 114, and the single array unit 104 likewise operates in the same fashion as described above for but a single element. The combined effect is that any radiation will have components in one or more of the three arrays of strips and will be thereby absorbed by those arrays to produce an omnidirectional response to the radiation.

The outside dimensions of the detector unit 14 are quite small, for example, a couple of inches in diameter, which makes it very convenient and compact in handling or in wearing on the person. Moreover, unlike a detector system based on the use of an antenna with its lossless metallic conductors which are essentially opaque to radiation, there is no dimensional-frequency relationship in the relatively transparent thin-film resistive strips 38 of unit 14. That is, the dimensions of antenna structures are strongly frequency dependent in the frequency range where the ratio of the antenna dimensions to wavelength is very much less than 1 (for example, in the effective aperture of horns or in the effective length of dipoles). The average dimension or length (e.g. about an inch or less) of a strip 38 or 39 is very much less than the wavelength at the low frequency end of the broadband spectrum (e.g. 1 megaHerz) and very much greater than the wavelength at the high frequency end. Actually, a wide range of practical values can be used for the dimensions of the detector unit 14 without impairing the broadband character of its operation.

The thermal time constant of the relatively bulky styrofoam housing and thermal-sink discs is of the order of minutes, while that of the detector element 32 or 34 with its extremely thin substrate and thin films is a fraction of a second. Thus, rapid response is assured to the radiant fields to be measured, while there is a slow response to changes in the ambient temperature. With the sensitivity of the detector unit to extremely small field density levels, it can be used to give an alarm to a radiation field transient of about 100 microwatts or less.

The calibration of the detector unit can be done using known techniques for calibrating thin-film thermoelectric calorimeters for microwave power meters. An audio signal, e.g. 1 kH$_z$, may be used as the calibrating signal applied to the terminals of the unit 14, and the generated d-c voltage at those terminals is measured at the same time. From the voltage and current of the audio, the input power is determined and it represents the power absorbed by the thin films. In addition, the percentage of absorption of the radiant field is known by the geometry and dimensions of the strip, so that the corresponding densities of the radiation field can be determined for the different audio power levels, and the d-c voltage output correspondingly calibrated.

Various modifications of this invention will be apparent to those skilled in the art from the above description of an illustrative embodiment of the invention. For example, a circular form has been found suitable for the detector unit 14 due to the general convenience in engineering such shapes. Square and other shapes are also suitable. For example, in the detector elements 32 and 34 shown in FIG. 6 the zig-zag arrays 41 take on a generally octagonal shape to present a tapered edge so as to minimize reflections of an E field having an edge-lit incidence; other configurations are also suitable. Likewise, the planar form of the arrays 41 is generally more practical from an engineering standpoint. For some applications, it may be desirable to form the grid on a spherical or other shaped surface.

From the above description, it is seen that a new and improved radiation detector is provided by this invention. That is, the arrays of parallel strips 38 and 39 serve as a fairly transparent resistive screen in space for extracting and absorbing a substantially constant fraction of the incident power flow from the radiant field. The power densities of incident waves can be measured in terms of the fractional power absorbed by that screen. Sufficient transparency of the screen keeps the effects of reflection and diffraction at a minimum, and the almost purely resistive nature of the screen assures the substantial constancy of the fractional absorption with frequency to achieve an ultra broadband radiation probe. An additional feature of this probe is that, unlike an antenna, it does not disturb the near field. Moreover, the probe's operation is especially suitable as a radiation hazard meter, in that the probe absorbs radiation via the electric field component on a substantially isotropic basis just as does the human body, and without disturbance of the near field. For the measurement of the absorbed power, the thin-film strips 38 and 39 as thermocouples are effective to furnish a proportional electrical signal and as strips they are readily connected in electrical paths for cumulative development of the individual thermocouple signals as well as to external measurement circuits.

What is claimed is:

1. An electrical circuit device for detecting free space radio frequency radiation fields, said device including:
    a plurality of spaced conductive strips in the form of thin resistive films whose thickness is small compared to the skin depth at the radio frequency, said strips being connected in an electrically conductive path,
    and a non-metallic housing for said strips including means for surrounding said strips with dielectric material for passing said radiation fields to said strips,
    the area of spacing between adjacent ones of said strips being greater than the area of said strips so that the impedance of said strips is largely resistive over a broad band of radio frequencies.

2. A radiation detecting device as recited in claim 1 wherein said strips have thermal characteristics so that changes in temperature with absorption of radiation can be detected.

3. A radiation detecting device as recited in claim 2 wherein said strips include thermoelectric materials forming thermocouples.

4. A radiation detecting device as recited in claim 2 wherein each of said strips includes a plurality of thermocouples connected in series-aiding relation, and said strips are connected in series-aiding relation.

5. A radiation detecting device as recited in claim 4 wherein a first plurality of said strips are parallel and are arranged to be transverse to a second plurality of said strips to be respectively responsive to two transverse components of an electric field.

6. A radiation detecting device as recited in claim 5 wherein a third plurality of said strips are parallel and are arranged to be transverse to the strips of said first and second pluralities to be responsive to a third transverse component of an electric field.

7. A radiation detecting device as recited in claim 5 wherein the strips of said first and second pluralities cross each other at the cold junctions thereof; and further comprising dielectric means having a high thermal conductivity and connected in thermally conductive relation to said cold junctions to provide a substantially uniform reference temperature for said cold junctions.

8. An electrical circuit device for detecting radio frequency radiation, said device including:

a plurality of spaced conductive strips in the form of thin resistive films whose thickness is small compared to the skin depth at the radio frequency, said strips having substantial resistance and being connected in an electrically conductive path, a first group of said strips being parallel and a second group of said strips being parallel and transverse to said first strips to form a grid, the spacing between adjacent ones of said parallel strips being greater than the width of said strips, so that the impedance of said grid of strips to free space radio frequency radiation is largely resistive over a broad band of radio frequencies, and dielectric means for mounting said strips for exposure to free space radiation fields.

9. A radiation detecting device as recited in claim 8 wherein the resistance of each of said strips is less than 100 ohms per square, and the equivalent resistance of said grid of strips to free space radio frequency radiation is greater than 300 ohms per square.

10. A thermoelectric device for radiation detection comprising:

a plurality of conductive means forming thermocouples formed of different thin resistive films connected in a sequence of alternatingly different films connected to form a plurality of cold junctions and hot junctions therebetween;

and dielectric means spaced from said hot junctions and having a high thermal conductivity and connecting said cold junctions in thermally conductive relation to provide a substantially uniform reference temperature for said cold junctions.

11. A radiation detecting device as recited in claim 10 wherein said conductive means includes a thin dielectric planar substrate with said films deposited thereon; said dielectric means includes a block of dielectric material having a plurality of projecting pads for engaging said substrate at said cold junctions.

12. A radiation detecting device as recited in claim 11 wherein said dielectric material is boron nitride.

13. A radiation detecting device as recited in claim 10, wherein said dielectric means has a substantial bulk and forms a thermal sink for said cold junctions.

14. An electrical circuit device for detecting free space radio frequency radiation fields, said device including:

a plurality of spaced conductive strips in the form of thin resistive films whose thickness is small compared to the skin depth at the radio frequency, said strips being connected in an electrically conductive path, and a non-metallic housing for said strips including means for surrounding said strips with dielectric material for passing said radiation fields to said strips, said strips being arranged to present a generally resistive impedance substantially greater than that of free space to said radio frequency radiation fields and having a negligible reflective characteristic, said detecting device having the property that, for a value of ohms per square equal to free space, power absorption from free space by said strips is not a maximum.

15. A radiation detecting device as recited in claim 14 wherein said transverse strips have a transmission characteristic to transmit at least about half of said radiation field to which said strips are exposed.

16. A radiation transformer for radiation fields at radio frequencies comprising:

a non-metallic housing containing a plurality of spaced resistive strips with the spacing between said strips being large compared to the width of the strips, and means for deriving electrical signals from said strips;

said transformer having the property that, for a value of ohms per square equal to free space, power absorption from free space by the transformer is not a maximum.

17. A radiation transformer as recited in claim 16, and further comprising a second plurality of spaced resistive strips having a construction similar to that of the first mentioned plurality of resistive strips and oriented transversely thereto and connected electrically to said first plurality of strips.

18. A radiation transformer as recited in claim 16, wherein said strips each include a plurality of thermocouples.

19. A device for detecting free space radio frequency radiation, said device comprising:

an electrically continuous resistive strip with, separate portions extending in transverse directions over an area and having a largely resistive impedance effective over said area to free space radio frequency radiation and substantially greater than that of free space and having a negligible reflective characteristic, said detecting device having the property that, for a value of ohms per square equal to free space, power absorption from free space by the detecting device is less than a maximum.

20. A free space radiation detecting device as recited in claim 19, wherein said separate portions extend at substantially right angles corresponding respectively to orthogonal components of the free space radiation.

21. A device for detecting free space radio frequency radiation as recited in claim 19, wherein said strip includes an additional portion extending transversely to said separate portions.

22. A device for detecting free space radio frequency radiation, as recited in claim 21, wherein said separate and additional portions respectively extend along three orthogonal axes corresponding respectively to orthogonal components of free space radiation.

23. A device for detecting free space radio frequency radiation as recited in claim 19, wherein said resistive impedance is a plurality of times that of free space.

24. A device for detecting free space radio frequency radiation as recited in claim 19, wherein said resistive impedance is about 1,000 ohms.

25. A device for detecting free space radio frequency radiation as recited in claim 19, and further comprising a dielectric and thermally insulating enclosure for said strip to permit the passage of free space radio frequency radiation and to isolate said strip from external infra-red radiation.

26. A device for detecting free space radio frequency radiation as recited in claim 19, and further comprising means for connecting said resistive strip in a measuring circuit.

27. A device for detecting free space radio frequency radiation as recited in claim 19, wherein said resistive strip has electrical characteristics that vary with the amount of radiation absorbed thereby.

28. A device for detecting free space radio frequency radiation as recited in claim 27, wherein each of said separate strip portions includes a thermocouple.

29. A device for detecting free space radio frequency radiation as recited in claim 28, wherein each of said separate strip portions includes a plurality of series connected thermocouples extending in the direction of the strip portion.

30. A device for detecting free space radio frequency radiation as recited in claim 19, wherein said separate strip portions extend along orthogonal sides of a unit square, and the width of said strip is substantially less than the length of a side of said unit square.

31. A device for detecting free space radio frequency radiation as recited in claim 30, wherein the length of said unit square side is many times the width of said strip.

32. A radiation detecting device as recited in claim 10, wherein said dielectric means includes a substantially solid member for thermally isolating said thermocouples from external infra-red radiation.

33. A free space radiation detecting device as recited in claim 32, wherein said dielectric means further includes a second substantially solid member similar to the first-mentioned solid member for enclosing said thermocouples.

* * * * *

UNITED STATES PATENT OFFICE
CERTIFICATE OF CORRECTION

Patent No. 3,931,573      Dated January 6, 1976

Inventor(s) Samuel Hopfer

It is certified that error appears in the above-identified patent and that said Letters Patent are hereby corrected as shown below:

Abstract - Cover page, right-hand column, name presented after line 4: The name should read -- Morton C. Jacobs --

Column 9, line 65, "edge-lot" should read -- edge-lit --.

Claim 19, line 3, after "with" the comma should be deleted.

Signed and Sealed this

Seventh Day of June 1977

[SEAL]

Attest:

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,931,573
DATED : January 6, 1976
INVENTOR(S) : Samuel Hopfer

It is certified that error appears in the above-identified patent and that said Letters Patent are hereby corrected as shown below:

In Column 1, insert the following statement in the first paragraph of the specification:

-- The invention herein described was made in the course of or under a contract with the Department of the Air Force. --.

Signed and Sealed this

Twenty-third Day of October 1979

[SEAL]

Attest:

RUTH C. MASON
Attesting Officer

LUTRELLE F. PARKER
Acting Commissioner of Patents and Trademarks